(12) United States Patent
Wostyn et al.

(10) Patent No.: US 10,468,483 B2
(45) Date of Patent: Nov. 5, 2019

(54) HORIZONTAL NANOWIRE SEMICONDUCTOR DEVICES

(71) Applicant: IMEC VZW, Leuven (BE)

(72) Inventors: Kurt Wostyn, Lubbeek (BE); Hans Mertens, Leuven (BE)

(73) Assignee: IMEC VZW, Leuven (BE)

( * ) Notice: Subject to any disclaimer, the term of this patent is extended or adjusted under 35 U.S.C. 154(b) by 45 days.

(21) Appl. No.: 15/822,478

(22) Filed: Nov. 27, 2017

(65) Prior Publication Data
US 2018/0166535 A1 Jun. 14, 2018

(30) Foreign Application Priority Data

Dec. 9, 2016 (EP) .................... 16203205

(51) Int. Cl.
H01L 29/06 (2006.01)
H01L 21/306 (2006.01)
H01L 29/66 (2006.01)
H01L 29/08 (2006.01)
H01L 29/423 (2006.01)
H01L 29/786 (2006.01)
H01L 21/02 (2006.01)

(52) U.S. Cl.
CPC .... H01L 29/0673 (2013.01); H01L 21/02532 (2013.01); H01L 21/02538 (2013.01); H01L 21/30604 (2013.01); H01L 21/30612 (2013.01); H01L 29/0649 (2013.01); H01L 29/0847 (2013.01); H01L 29/42392 (2013.01); H01L 29/66522 (2013.01); H01L 29/66545 (2013.01); H01L 29/66553 (2013.01); H01L 29/66742 (2013.01); H01L 29/78651 (2013.01); H01L 29/78681 (2013.01); H01L 29/78684 (2013.01); H01L 29/78696 (2013.01)

(58) Field of Classification Search
CPC combination set(s) only.
See application file for complete search history.

(56) References Cited

U.S. PATENT DOCUMENTS

| 7,338,874 | B2 | 3/2008 | Oh et al. |
| 8,502,288 | B2 | 8/2013 | Guo et al. |
| 9,070,710 | B2 | 6/2015 | Fu et al. |
| 9,275,995 | B2 | 3/2016 | Kim et al. |
| 2015/0255571 | A1 | 9/2015 | Xu et al. |
| 2017/0213888 | A1* | 7/2017 | Chang ................. H01L 29/0649 |

(Continued)

FOREIGN PATENT DOCUMENTS

WO    2015/147792 A1    10/2015

Primary Examiner — Nduka E Ojeh
(74) Attorney, Agent, or Firm — McDonnell Boehnen Hulbert & Berghoff LLP

(57) ABSTRACT

The present disclosure relates to a method of forming a semiconductor device comprising horizontal nanowires. The method comprises depositing a multilayer stack on a substrate, the multilayer stack comprising first sacrificial layers alternated with layers of nanowire material; forming at least one fin in the multilayer stack; applying an additional sacrificial layer around the fin such that a resulting sacrificial layer is formed all around the nanowire material; and forming a nanowire spacer, starting from the resulting sacrificial layer, around the nanowire material at an extremity of the nanowire material. The present disclosure also relates to a corresponding semiconductor device.

8 Claims, 4 Drawing Sheets

(56) References Cited

U.S. PATENT DOCUMENTS

| | | | |
|---|---|---|---|
| 2018/0006139 A1* | 1/2018 | Seo | H01L 29/66795 |
| 2018/0090624 A1* | 3/2018 | Cheng | H01L 29/78696 |
| 2018/0219083 A1* | 8/2018 | Guillorn | H01L 29/66553 |
| 2018/0254321 A1* | 9/2018 | Wostyn | H01L 29/0653 |

* cited by examiner

HORIZONTAL NANOWIRE SEMICONDUCTOR DEVICES

CROSS-REFERENCE TO RELATED APPLICATIONS

The present application is a non-provisional patent application claiming priority to European Patent Application No. 16203205.6, filed Dec. 9, 2016, the contents of which are hereby incorporated by reference.

FIELD OF THE DISCLOSURE

The disclosure relates to the field of semiconductor devices. More specifically it relates to a method of forming a semiconductor device comprising horizontal nanowires and to a fin for making a semiconductor device comprising nanowires.

BACKGROUND

The formation of stacked nanowires is an important step for decreasing the feature sizes of semiconductor devices.

One important issue which has to be tackled is to reduce the parasitic capacitance due to overlap between the gate and source-drain region of a transistor.

In order to minimize this parasitic capacitance, the formation of an internal spacer has to be an integral part of the nanowire integration scheme.

Forming the internal spacer adds additional requirements to the method for forming a semiconductor device comprising horizontal nanowires. There is therefore room for improvement in the methods for forming such semiconductor devices.

SUMMARY

It is an object of embodiments of the present disclosure to provide a good method for forming a semiconductor device comprising horizontal nanowires and to provide a good semiconductor device comprising nanowires.

The above objective is accomplished by a method and device according to the present disclosure.

In a first aspect embodiments of the present disclosure relate to a method of forming a semiconductor device comprising horizontal nanowires. The method comprises:
  depositing a multilayer stack on a substrate, the multilayer stack comprising first sacrificial layers alternated with layers of nanowire material,
  forming at least one fin in the multilayer stack,
  applying an additional sacrificial layer around the fin such that a resulting sacrificial layer is formed all around the nanowire material,
  forming a nanowire spacer, starting from the resulting sacrificial layer, around the nanowire material at an extremity of the nanowire material.

In embodiments according to the present disclosure the resulting sacrificial layer comprises the first sacrificial layers and the additional sacrificial layer. In an example embodiment, the resulting sacrificial layer is formed all around the nanowires. This allows formation of a nanowire spacer around the nanowire material at an extremity of the nanowire material. As the nanowire spacer is formed around the nanowire material, all parts of the nanowire spacer (e.g., the top part, the bottom part and the side parts, the parts around each of the different nanowires) are automatically aligned because all these parts are formed using the same process steps. The alignment is therefore intrinsic to the integration scheme in accordance with embodiments of the present disclosure. Hence, a self-alignment between the spacer around the different nanowires is realised. This is different from other methods where an alignment between the gate spacer (applied next to the gate) and the internal spacer is required. In such methods, it would be required to carefully tune the internal spacer module, e.g., by matching the selective oxidation or removal to the thickness of the gate spacer. Since the nanowire spacer is formed all around the nanowire material at an extremity of the nanowire material, in an example embodiment, the gate length is the same for all the nanowires formed during the process. In example embodiments, they are applicable to different nanowire device architectures. Examples thereof are Si, SiGe, Ge, or III/V nanowire integration schemes.

In embodiments of the present disclosure, after applying the additional sacrificial layer, a dummy gate stack is applied.

In embodiments according to the present disclosure, the dummy gate stack comprises a dummy gate dielectric and a dummy gate. The dummy gate dielectric thereby protects the fin during gate etch. In embodiments according to the present disclosure, the additional sacrificial layer is applied during the dummy gate formation.

In embodiments of the present disclosure, forming the fin comprises etching or STI recess.

In embodiments of the present disclosure, the additional sacrificial layer is formed after the at least one fin and STI are formed, but before the dummy gate dielectric and the dummy gate are formed. In example embodiments, the additional sacrificial layer is correctly positioned in the subsequent modules such that self-alignment of the nanowire spacers is achieved.

In embodiments of the present disclosure, during formation of the nanowire spacer, part of the resulting sacrificial layer is selectively removed.

In embodiments of the present disclosure, part of the resulting sacrificial layer is removed and replaced by a dielectric (the part in the region where the nanowire spacer is formed). In the regions where the S/D will be formed and the regions where the gate will be formed, the resulting sacrificial layer will only be removed at various stages of the flow.

In embodiments of the present disclosure, part of the resulting sacrificial layer is isotropically removed.

Several methods may be used for selective removal and they may be based on the nanowire and sacrificial layer composition:
  (1) Si wire by SiGe selective etch: methods of selective etch are, e.g., HCl (g), dry etch, $HF:H_2O_2:CH_3COOH$ mixtures
  (2) SiGe wire by Si selective etch: can be done by, e.g., TMAH, $NH_4OH$, KOH, etc. (alkaline solutions) or dry etching.
  (3) Ge wire by SiGe selective etch using formulated mixtures
  (4) InGaAs wire by InP selective etch in HCl (aq).

In embodiments of the present disclosure, the additional sacrificial layer is applied using conformal deposition.

In embodiments of the present disclosure, a source or drain region is applied next to the nanowire spacer such that the nanowire spacer is in between the dummy gate and the source or drain region.

In embodiments of the present disclosure, the resulting sacrificial layer is etched to obtain the nanowires.

In embodiments of the present disclosure, a gate stack is applied around the nanowires.

In example embodiments, the gate stack is aligned with the nanowire spacer. As the nanowire spacer is aligned for the different nanowires this provides that nanowires with a fixed gate length can be achieved.

In a second aspect, embodiments of the present disclosure relate to a semiconductor device comprising at least one nanowire made of nanowire material, a first electrode at a first extremity of the nanowire and a control electrode all around the nanowire, with in between the control electrode and the first electrode, a first spacer all around the nanowire at the first extremity of the nanowire.

In embodiments of the present disclosure, the semiconductor device comprises a second electrode at a second extremity of the nanowire opposite to the first extremity, with in between the control electrode and the second electrode, a second spacer all around the nanowire at the second extremity of the nanowire.

In embodiments according to the present disclosure, the first electrode is a source electrode, the second electrode is a drain electrode, and the control electrode is a gate electrode. In example embodiments, the gate length is the same for the different nanowires of the semiconductor device and the gate length is uniform around the nanowire. The reason therefore being that the spacer is present all around the nanowire.

In embodiments of the present disclosure, the nanowire material comprises at least one element selected from the group consisting of Si and Ge, or selected from the group of III-V compound materials.

In embodiments of the present disclosure, the nanowire material may for example comprise Si, or Ge, or SiGe, a III-V compound material. Such a III-V compound material can be binary such as GaAs or GaP, or it can be ternary such InGaAs.

In embodiments of the present disclosure, the nanowire material is doped.

Various aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

BRIEF DESCRIPTION OF THE FIGURES

The above, as well as additional, features will be better understood through the following illustrative and non-limiting detailed description of example embodiments, with reference to the appended drawings.

Figure 1:
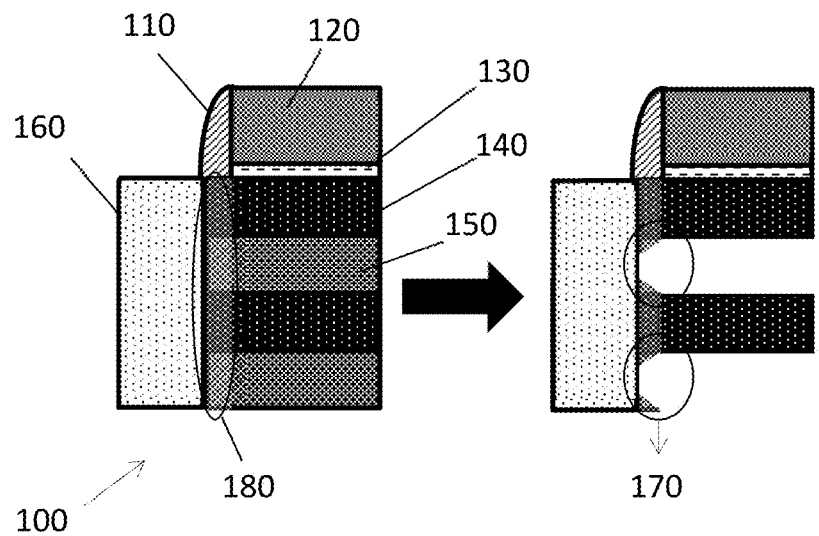
FIG. 1 schematically shows the longitudinal cross-section of a fin made of a multilayer stack, before and after removal of the internal sacrificial layer.

Any reference signs in the claims shall not be construed as limiting the scope.

In the different drawings, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Where in embodiments of the present disclosure reference is made to the nanowire spacer, reference is made to a spacer, which is all around the nanowire material at an extremity of the nanowire material. This extremity of the nanowire material may for example be the nanowire material positioned next to the dummy gate.

Where in embodiments of the present disclosure reference is made to the gate spacer, reference is made to the spacer next to the dummy gate and the dummy gate dielectric. This spacer may also be referred to as the initial spacer.

Where in embodiments of the present disclosure reference is made to the nanowire material, reference is made to material from which the nanowires are made.

FIG. 1 schematically shows the longitudinal cross-section of a fin 100 made of a multilayer stack. The fin is shown before (left) and after (right) selective etching during the replacement metal gate (RMG) process. The left figure shows a source or drain region (S/D) 160, the nanowire material 140, the first sacrificial layers 150, and on top thereof the dummy gate dielectric (e.g., oxide) 130 and the dummy gate 120, the gate spacer 110 next to the dummy gate 120 and the dummy gate dielectric 130, and the extension 180 next to the S/D region 160. These extensions 180 are the (doped) regions that form the connections between the lowly-doped or intrinsic nanowire channels and the heavily-doped S/D regions. These extensions 180 could be made by ion implantation after dummy gate formation or by diffusion after S/D formation. The right figure shows the nanowires 140 after the etching. This figure illustrates that the selective etching results in a spacer undercut 170. This spacer undercut leads to a parasitic capacitance due to the gate to source and gate to drain overlap.

Figure 2:
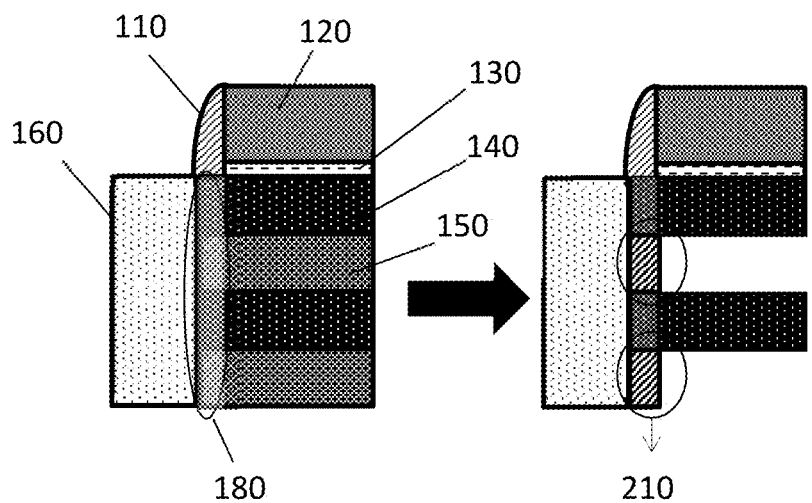
FIG. 2 schematically shows the longitudinal cross-section of a fin made of a multilayer stack, wherein spacers are introduced to reduce the source/drain to gate capacitance.

In other methods this may be solved by providing internal spacers. Such a spacer is present between the nanowires. Such an internal spacer allows lowering of the source/drain to gate capacitance. This is schematically illustrated in FIG. 2 showing the internal spacers 210 that reduce the impact of the gate to source and gate to drain overlap. Except for the internal spacers 210, this figure is the same as FIG. 1. This stack is formed by applying the following steps. In a first step a multilayer stack is deposited on a blank wafer. In a next step this multilayer stack is patterned into a fin 100. Next a dummy gate 120 is deposited around the fin 100. The dummy gate 120 may for example comprise amorphous silicon. Before depositing the dummy gate 120 a dummy gate dielectric 130 may have been deposited around the fin 100. The dummy gate dielectric may for example be a silicon oxide. In additional steps the gate spacer 110 and the source drain regions 160 are formed.

Internal spacer 210 formation can be done in several ways, such as:

(1) For recessed source-drain, first fin recess etch followed by:

a. Selective recess of the sacrificial layer followed by deposition followed by source/drain deposition b. Selective deposition on or oxidation of the sacrificial layer c. Selective recess of the sacrificial layer followed by selective deposition on or selective oxidation of the sacrificial layer followed by source/drain deposition (2) For wrap-around source-drain and contacts, this could be done similar to the above but not with recessed fin. Wire release in the source/drain module can be combined with the above under (1).

Selective etch can be done in several ways. The selective etches that can be used are for example:

SiGe vs Si selective etch: gas phase HCl, dry etch, $HF/H_2O_2/CH_3COOH$ mixtures and formulated mixtures Si vs SiGe: $NH_4OH$, TMAH, KOH, . . . (alkaline solutions in general)

SiGe vs Ge: formulated chemical mixtures

InP vs InGaAs: aqueous HCl

Selective oxidation can for example be done by steam oxidation or by dry oxidation.

Internal spacer formation can for example also be done by selective oxidation; or a combination of selective etch and selective oxidation.

In FIG. 2 the selective etching is done using TMAH etching (Tetramethylammonium hydroxide). In FIG. 2, the internal spacer 210 and the gate spacer 120 are well aligned.

In an example embodiment, when forming such an internal spacer this spacer is aligned with the gate spacer next to the dummy gate to obtain equal and uniform channel lengths for all stacked nanowires.

Figure 3:
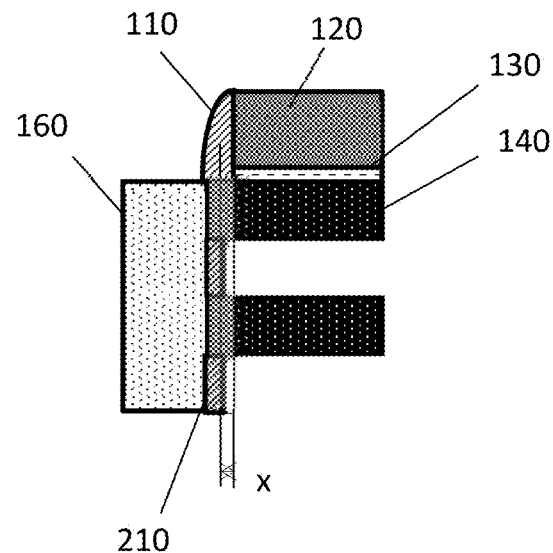
FIG. 3 schematically illustrates the misalignment between the gate spacer and the internal spacer.

Aligning the internal spacer 210 to the gate spacer 110 is however difficult, it is not obvious and requires careful process control. Aligning the internal spacer 210 with the gate spacer 110 is therefore problematic and may result in a misalignment between both. An example thereof is illustrated by the dimension line 'x' in FIG. 3.

Therefore, in embodiments of the present disclosure, prior to positioning the dummy gate, an additional sacrificial layer is applied. In embodiments of the present disclosure the resulting sacrificial layer is all around the nanowires. In a first aspect embodiments of the present disclosure relate to a method 400 of forming a semiconductor device comprising horizontal nanowires. The method comprises depositing step 410 a multilayer stack a substrate. The multilayer stack comprises an alternating sequence of layers of nanowire material and first sacrificial layers. The method comprises forming step 420 at least one fin in the multilayer stack. This fin hence comprises an alternating sequence of first sacrificial layers and nanowire material. The method comprises applying step 430, after the fin formation, an additional sacrificial layer around the fin such that a resulting sacrificial layer is formed all around the nanowires. The additional sacrificial layer may for example be formed after the fin etch, after STI recess or prior to dummy gate formation. The method comprises forming step 440 a nanowire spacer all around the nanowires. The nanowire spacer is formed starting from the resulting sacrificial layer. In example embodiments, the nanowire spacer is around the nanowire material at an extremity of the nanowire material. Hence, the alignment around the nanowire material will be determined by the selective removal of this resulting sacrificial layer. Thus a self-aligned integration scheme is created meaning that the alignment is intrinsic to the integration scheme. In other methods, no additional sacrificial layer is formed and hence no spacer is all around the nanowires material. In these methods, the spacer formed based on the first sacrificial layer is an internal spacer in between the nanowire material. Hence, in these methods, it is required that the internal spacer is aligned with the gate spacer.

It is an important aspect of embodiments of the present disclosure that the additional sacrificial layer is applied around the fin such that a resulting sacrificial layer is formed all around the nanowire material. If the additional sacrificial layer would only be on top, the alignment would only be present on top of the fin. In that case only the spacer at the top interface of the top nanowire would be self-aligned to the bottom and top interfaces of the other nanowires, but the side-wall interfaces of all nanowires would not be self-aligned to this reference plane.

Figure 4:
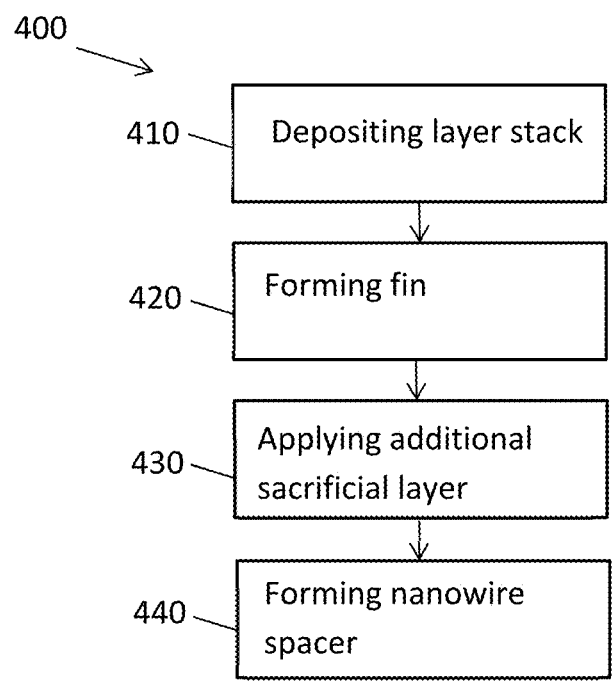
FIG. 4 is a flow chart showing a sequence of method steps of a method in accordance with an exemplary embodiment of the present disclosure.

FIG. 4 is a flow chart showing a sequence of method steps of a method in accordance with an exemplary embodiment of the present disclosure. The method comprises depositing 410 the multilayer stack on the wafer, forming 420 the fin, applying 430 the additional sacrificial layer, forming 440 the nanowire spacer.

Figure 5:
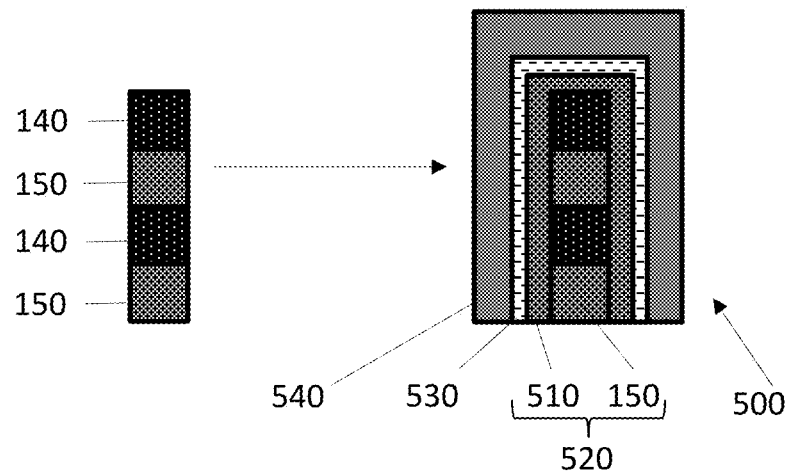
FIG. 5 schematically shows the cross-section of a fin comprising an additional sacrificial layer in accordance with embodiments of the present disclosure.

The left drawing of FIG. 5 schematically shows the cross-section of a fin 500. This may be obtained after fin etching or after STI recess. The cross-section shows an alternating stack of nanowire material 140 and first sacrificial layers 150. The right drawing shows the cross-section of the nanowire stack after applying an additional sacrificial layer 510 which covers the fin. This results in a resulting sacrificial layer 520 which is formed all around the nanowire material 140. The resulting sacrificial layer 520 comprises the additional sacrificial layer 510 and the first sacrificial layers 150. In this exemplary embodiment of the present disclosure the additional sacrificial layer 510 is made of the same material as the first sacrificial layer 150. Around the additional sacrificial layer 510 a dummy gate dielectric 530 is applied and around the dummy gate dielectric 530 the dummy gate 540 is applied.

Next, the standard nanowire processing steps such as gate etching and spacer etching are applied.

Figure 6:
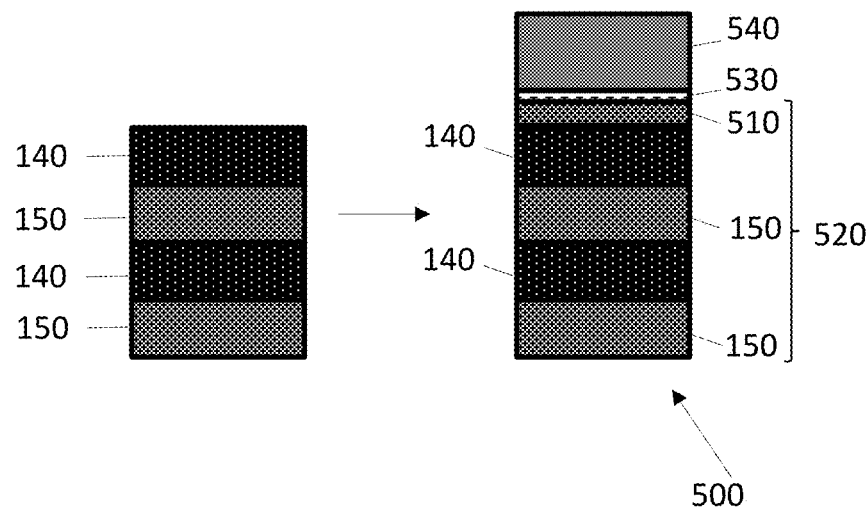
FIG. 6 schematically shows the longitudinal cross-section of a fin comprising an additional sacrificial layer in accordance with embodiments of the present disclosure.

The left drawing of FIG. 6 schematically shows the longitudinal cross-section of the same fin or nanowire stack as in FIG. 5. The right drawing shows the longitudinal cross-section of the nanowire stack after applying the additional sacrificial layer 510, the dummy gate dielectric 530 and the dummy gate 540.

Figure 7:
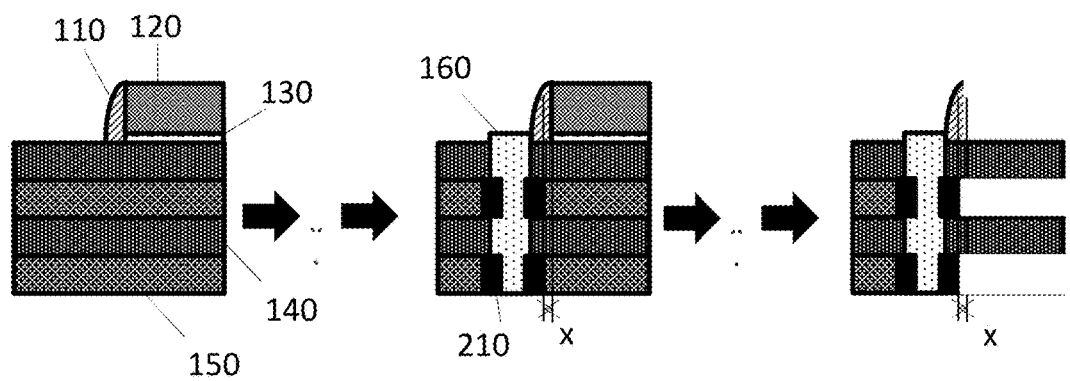
FIG. 7 shows the formation of an internal spacer starting from a multilayer stack which does not comprise a resulting sacrificial layer all around the nanowire material.

FIG. 7 shows the formation of an internal spacer 210 starting from a multilayer stack which does not comprise a resulting sacrificial layer all around the nanowire material. The left graph shows a longitudinal cross-section of such a stack. The stack comprises nanowire material 140 and first sacrificial layers 150 which are alternatingly stacked. A dummy gate dielectric 130 is present on top of the topmost nanowire material layer 140. A dummy gate 120 is present on top of the dummy gate dielectric 130. The dummy gate dielectric protects the fin structures during dummy gate etch. FIG. 7 shows a gate spacer 110 next to the dummy gate 120 and the dummy gate dielectric 130. After recessing the fins in the source/drain regions and after forming the internal spacer 210 (by e.g., selective oxidation or selective etch, conformal dielectric deposition and etchback) and after the source/drain 160 is formed by selective epitaxial growth, A stack is obtained as illustrated in the middle drawing of FIG. 7. In such a process, the alignment between the gate spacer 110 and the internal spacer 210 is determined by the internal spacer formation process. This may for example be controlled by timed selective removal and/or by selective oxidation. This, however, is difficult to control and therefore may lead to a misalignment between the gate spacer 110 and the internal spacer 210 as illustrated by the dimension line 'x' in FIG. 7. After selective etch in the RMG module, this results in a stack as illustrated in the right drawing of FIG. 7. As shown, this results in a misalignment between the gate spacer on one side of the nanowire and the internal spacer on the other side of the nanowire.

Figure 8:
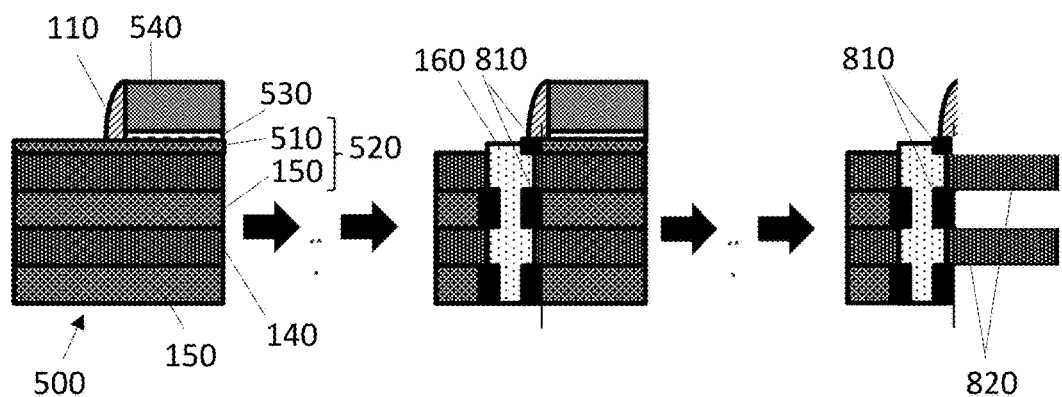
FIG. 8 shows the formation of a nanowire spacer starting from a multilayer stack which comprises a sacrificial layer all around the nanowire material in accordance with embodiments of the present disclosure.

FIG. 8 shows the formation of a nanowire spacer 810 starting from a multilayer stack, which comprises a resulting sacrificial layer 520 all around the nanowire material 140 in accordance with embodiments of the present disclosure. The left graph shows a longitudinal cross-section of such a stack. The stack comprises nanowire material 140 and first sacrificial layers 150 which are alternatingly stacked. Additionally, the stack comprises an additional sacrificial layer 510 all around the stack. A dummy gate dielectric 530 is present on top of the additional sacrificial layer 510. A dummy gate 540 is present on top of the dummy gate dielectric 530. FIG. 8 shows a gate spacer 110 next to the dummy gate 540 and the dummy gate dielectric 530. After forming the nanowire spacer 810 (which is formed starting from the resulting sacrificial layer 520 and can be formed by for example selective oxidation or selective etch, conformal dielectric deposition and etchback, or a combination of selective etch and deposition/oxidation) and the source/drain 160 (e.g., by selective epitaxial growth), a stack is obtained as illustrated in the middle drawing of FIG. 8. The nanowire spacer 810 is formed starting from the resulting sacrificial layer 520 next to the dummy gate 540. The nanowire spacer 810 is present between the source or drain 160 (S/D) and the dummy gate 540. In example embodiments, the nanowire spacer 810 is all around the nanowires. This can be achieved when starting from a stack wherein the sacrificial layer 520 is all around the nanowires. As the nanowire spacer 810 is all around the nanowires, the alignment of the spacer above, below and on the sides of the nanowire is obtained automatically. The reason therefore being that every part of the nanowire spacer 810 all around the nanowire is obtained using the same process steps starting from the sacrificial layer 520 all around the nanowire. In example embodiments, it is not required to control the alignment between the gate spacer 110 and the nanowire spacer 810. The reason therefore being that the nanowire spacer is formed all around the nanowire material.

In embodiments of the present disclosure, the nanowire material can be undoped (doping concentration ~5E15 cm-3), lightly doped (doping concentration ~5E17 cm$^{-3}$), and heavily doped (doping concentration ~1E19 cm$^{-3}$).

The etching of the sacrificial layers 150, 510 may be isotropic or anisotropic. In an example embodiment, isotropic selective etch is used as this enables aligned nanowire spacers. In the case of anisotropic etch, e.g., the additional sacrificial layer thickness may be tuned in such a way as to lead to an identical recess. This also holds for selective oxidation in the case the oxidation process is dependent on the sacrificial layer thickness.

The spacer formation process may comprise a selective oxidation step. This oxidation step may be isotropic or anisotropic. In case of spacer formation using an anisotropic selective etch scheme, alignment can be achieved by matching the dimensions of the first sacrificial layers 150 and the additional sacrificial layer 510, because the lateral etch depth depends on sacrificial layer dimensions for anisotropic (i.e., crystal-orientation dependent) etch processes as a consequence of the formation of facets along the slowest etching crystal planes.

In a second aspect, embodiments of the present disclosure relate to a semiconductor device which comprises at least one nanowire 140, a first electrode 160 at one side of the nanowire 140 and a control electrode all around the nanowire. In between the control electrode and the first electrode, a first spacer all around the nanowire at an extremity of the nanowire is present.

The semiconductor device may comprise a second electrode at the side of the nanowire opposite to the side of the first electrode and a spacer in between the control electrode and the second electrode.

In an intermediate processing step, according to embodiments of the present disclosure, a fin 500 is formed for making a semiconductor device comprising nanowires. This fin comprises an alternating stack of nanowire material 140 and of first sacrificial layers 150. Moreover, an additional sacrificial layer is present around the alternating stack such that a resulting sacrificial layer is present all around each of the nanowires. An example of such a fin is schematically illustrated by the right graph of FIG. 5.

Depending on the embodiment of the present disclosure the method may be applied to different nanowire device architectures. Examples thereof are Si, SiGe, Ge, or III/V nanowire integration schemes.

In case the nanowire material 140 is Si, the material of the first sacrificial layers 150 and the additional sacrificial layer 510 may be SiGe. The germanium content of the sacrificial layers 150, 510 may for example range between 10% and 50%, or even between 20% and 50%, for example 30%.

In other embodiments of the present disclosure, the nanowire material 140 may be SiGe. These nanowire materials may have a germanium content between 20% and 50%, or even between 25% and 30%. In case of SiGe nanowire material 140, the material of the first sacrificial layers 150 and the additional sacrificial layers 510 may be silicon. In other embodiments of the present disclosure, the nanowire material 140 may be germanium. The germanium may for example be strained or relaxed germanium. In case of germanium nanowire material 140, the material of the first sacrificial layers 150 and the additional sacrificial layers 510 may be SiGe. The germanium content of the sacrificial layers 150, 510 may for example range between 50% and 80%, or even between 50% and 70%. In other embodiments of the present disclosure, the nanowire material 140 may be InGaAs. In case of InGaAs nanowire material 140, the material of the first sacrificial layers 150 and the additional sacrificial layers 510 may be InP.

In example embodiments, the nanowires can be stacked on top of each other. In embodiments of the present disclosure the top and bottom nanowire may be from a different type (e.g., nMOS and pMOS). This may for example be used for forming CFETs (complementary FETs). In embodiments of the present disclosure more than two nanowires can be stacked on top of each other.

The process using an additional sacrificial layer for forming horizontal nanowires in accordance with embodiments of the present disclosure may be used for making pMOS, for nMOS, or even combined pMOS/nMOS configurations.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method of forming a semiconductor device comprising horizontal nanowires, the method comprising:
    depositing a multilayer stack on a substrate, the multilayer stack comprising first sacrificial layers alternated with layers of nanowire material;
    forming at least one fin in the multilayer stack;
    applying an additional sacrificial layer around the at least one fin such that a resulting sacrificial layer is formed all around the nanowire material; and
    forming a nanowire spacer, starting from the resulting sacrificial layer, around the nanowire material at an extremity of the nanowire material, wherein part of the resulting sacrificial layer is isotropically removed.

2. The method according to claim 1, wherein after applying the additional sacrificial layer a dummy gate stack is applied.

3. The method according to claim 2, wherein a source or drain region is applied next to the nanowire spacer such that the nanowire spacer is in between the dummy gate stack and the source or drain region.

4. The method according to claim 1, wherein forming the at least one fin comprises etching or STI recess.

5. The method according to claim 1, wherein during formation of the nanowire spacer, part of the resulting sacrificial layer is selectively removed.

6. The method according to claim 1, wherein the additional sacrificial layer is applied using conformal deposition.

7. The method according to claim 1, further comprising etching the resulting sacrificial layer to obtain the horizontal nanowires.

8. The method according to claim 7, further comprising applying a gate stack around nanowires.

* * * * *